United States Patent [19]

Corsaro et al.

[11] 3,732,063

[45] May 8, 1973

[54] METHODS FOR SOLDERING BY UTILIZING A SOLDER BATH HAVING A THERMAL GRADIENT

[75] Inventors: Vincent A. Corsaro, Haverhill; Norman F. Smith, Methuen, both of Mass.

[73] Assignee: Western Electric Company, Incorporated, New York, N.Y.

[22] Filed: May 20, 1971

[21] Appl. No.: 145,244

[52] U.S. Cl.......................432/29, 29/498, 29/503, 228/36

[51] Int. Cl.......................F27b

[58] Field of Search......................29/471.1, 484, 498, 29/503; 117/114 R, 114 B, 51; 118/400, 429, DIG. 19; 228/36, 37; 263/52

[56] References Cited

UNITED STATES PATENTS

| | | | |
|---|---|---|---|
| 3,620,189 | 11/1971 | Hood | 118/DIG. 19 |
| 2,869,497 | 1/1959 | Lehner | 29/503 |
| 3,027,268 | 3/1962 | Linden | 118/429 X |
| 3,266,136 | 8/1966 | Gutbier | 29/471.1 |
| 3,478,878 | 11/1969 | Swaisgood | 117/114 R X |

*Primary Examiner*—J. Spencer Overholser
*Assistant Examiner*—Robert J. Craig
*Attorney*—W. M. Kain, R. P. Miller and J. B. Hofnagle, Jr.

[57] ABSTRACT

When mass soldering connections on a printed circuit board or other article by advancing the board across the surface of a solder bath, heat transfer to the board, icicle-like formations on the connections and uneven coating on the board are each minimized by utilizing an increasing temperature gradient along the path over which the board or article travels. The temperature gradient may be established and maintained because solder is a relatively poor conductor of heat. The temperature gradient is initially achieved and controlled by selectively controlling the heat applied to the bath so that more heat is applied to the exit portion of the bath than to the entrance portion. The temperature gradient is also influenced by heat losses both to the ambient atmosphere and to the boards passing through the bath.

3 Claims, 2 Drawing Figures

INVENTORS
V. A. CORSARO
N. F. SMITH
By J. R. Moses
ATTORNEY

METHODS FOR SOLDERING BY UTILIZING A SOLDER BATH HAVING A THERMAL GRADIENT

BACKGROUND OF THE INVENTION

1. Field of the Invention

This invention relates to methods of and apparatus for soldering by utilizing a thermal gradient solder bath, and more particularly to methods of and apparatus for maintaining an increasing temperature gradient along the length of a solder bath to minimize heat transfer to and icicle formation on printed circuit boards or other articles moving partially submerged through the bath.

2. Technical Considerations

At present, many solder connections or solder plates are effected by advancing an article with solder adhering elements or sections submerged in a bath of solder. In mass producing circuits carried upon substrates, it is often necessary to connect components mounted on the substrates to conductive paths. In the case of printed circuit boards or thin film circuits, this is often accomplished by passing leads of the components through an insulating substrate and into contact with conductive paths or terminal pads on the opposite side of the substrate. The leads are then usually bent to form initial mechanical and electrical connections with the circuit paths. Solder is then applied to make these connections more substantial by effectively making the leads integral with the conductive paths of the circuit.

In order to solder these connections rapidly, the printed circuit boards are often dragged or otherwise advanced across the surface of a bath of molten solder with the projecting leads submerged in the solder. Upon slowing the advancement of the circuit boards down, heat transfer from the solder to the printed circuit boards may become high enough to warp the boards or otherwise damage the boards and the components mounted thereon. There are two aspects involved in this undesirble heat transfer. First is thermal shock encountered by the relatively cool board when it initially encounters the molten solder. Second is the total amount of heat transferred to the board and/or the components mounted thereon as it is advanced over the surface of the bath. Any substantial reduction in either of these aspects without sacrificing speed of production or the quality of the solder connections would be beneficial.

In addition to the problem of detrimental heat transfer, there are the additional problems of uneven coating and excessive applications of solder to the connections. Concomitant with this problem is the formation of droplets which when soldering connections on a printed circuit board or the like often result in the development of icicles. The problems of uneven coating and droplet formation often occur in any type of coating process and are often difficult to solve.

In the case of printed circuit boards or other circuit substrates, the formation of icicles may hinder mounting of the boards in superimposed relation when the boards or substrates are separated from each other by discrete distances. Furthermore, icicle formation and the deposit of excess solder may cause an electrical circuit to malfunction by the establishment of short circuits or bridges between closely adjacent circuit paths, elements, or terminals. Any method of or apparatus for minimizing icicle formation is therefore highly desirable.

3. Prior Art

Numerous proposals have been advanced to minimize the detrimental effects of heat transfer and the formation of icicles; however, the prior art proposals do not lend themselves to accomplishing both of these ends in a single operation. For example, it has been suggested that the printed circuit boards can be preheated before engaging the hot surface of the molten solder in order to reduce thermal shock, however, this does not affect the formation of icicles one way or the other, neither does it reduce the total heat transfer to the board. It has been suggested that the temperature of the entire bath be lowered, however, this results in poor bonds at the connections being soldered and also apparently encourages the formation of icicles.

Many methods of and apparatus for reducing the formation of icicles have been proposed and many are currently being used with varying degrees of success. However, these proposals usually are not concerned with heat transfer to the board while still effecting a substantial solder connection. For example, the angles of entry and exit of the board into and from the bath have been controlled to discourage the formation of icicles. Heat treatment, ultrasonic vibrations and organic compounds placed on the surface of the solder have been tried in attempts to mitigate icicle formation, however, generally these approaches do not simultaneously deal with the heat transfer problem.

SUMMARY OF THE INVENTION

The present invention contemplates methods of an apparatus for reducing thermal shock to and formation of icicles on articles or printed circuit boards when the articles or printed circuit boards are moved across the surface of a solder bath during soldering operations. This is accomplished by providing an increasing temperature gradient along the path through the solder in which the boards travel as they are being soldered while maintaining constant temperature profiles normal to the direction of the path.

Apparatus for practicing the method of the present invention may include heaters positioned in a solder pot and spaced along the path of travel of the boards or articles through the solder bath. The heaters are controlled so that the solder at the entry side of the solder bath is substantially cooler than the solder at the exit side of the solder bath thereby providing an increasing temperature gradient along the path of travel of the board. In order to maintain constant temperature profiles normal to the path of travel, the heaters closest to the edge of the bath produce more than those nearer the centerline to compensate for heat transfer losses through the side of the pot containing the bath.

BREIF DESCRIPTION OF THE DRAWINGS

FIG. 1 is a perspective view partially cut away illustrating a solder bath having heaters disposed therein to establish a thermal gradient along the bath in accordance with the principles of the present invention for soldering components to a printed circuit board advancing therethrough; and FIG. 2 is a graph illustrating a range of temperature gradients of the solder bath of FIG. 1 by plotting the temperature rise over the length of the pot.

DETAILED DESCRIPTION

Figures 1, 2:
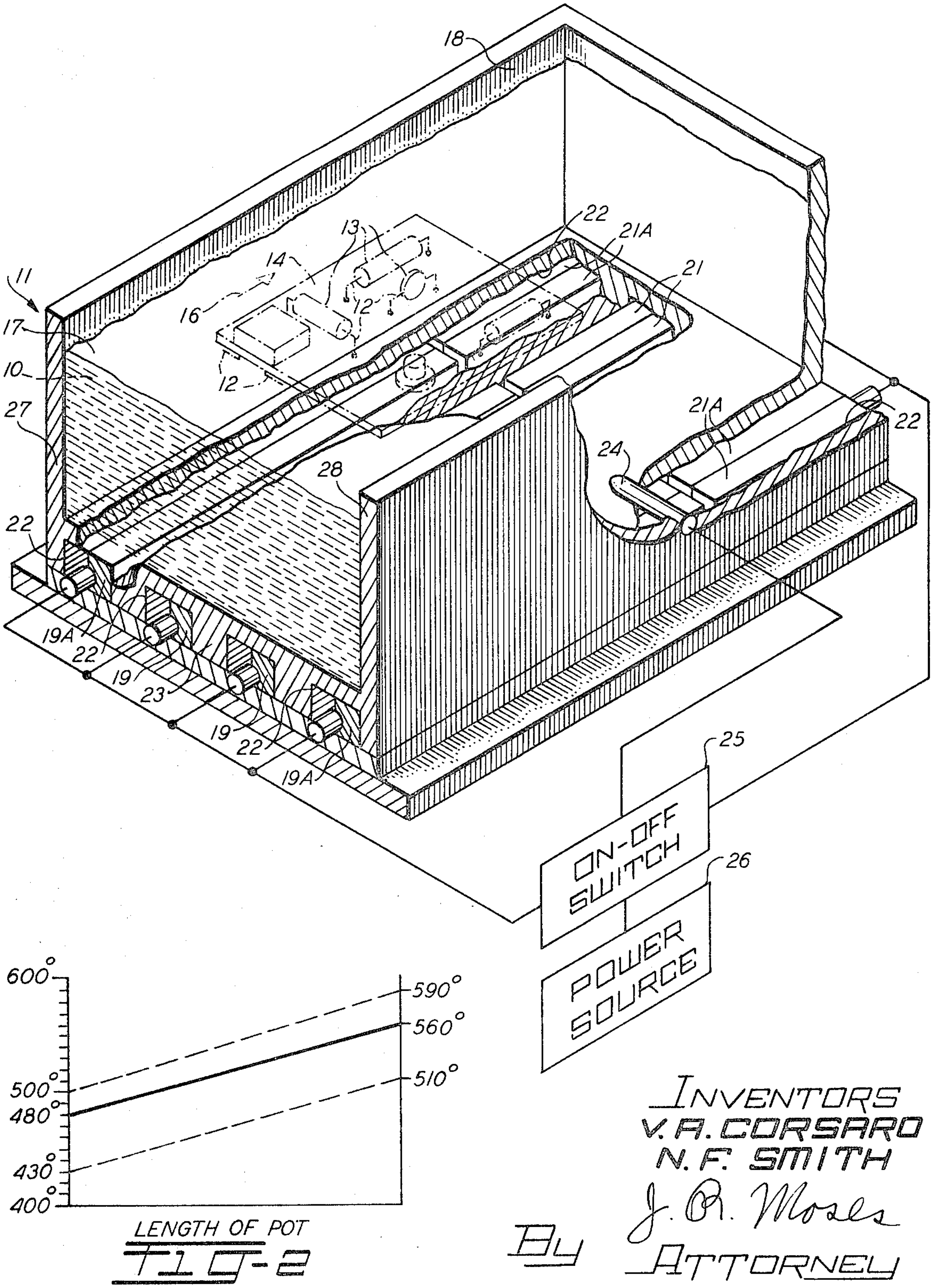

Referring now to FIG. 1 there is shown a stationary bath 10 of molten solder contained by a cast iron solder pot designated generally by the numeral 11. The bath 10 is used to solder leads 12 of components 13 to a printed circuit board 14 as the printed circuit board is advanced across the surface of the solder bath. The printed circuit board 14 may be advanced by a drag line or chain arrangement such as that disclosed in the patent to Corsaro and Smith, U.S. Pat. No. 3,570,741 issued Mar. 16, 1971, entitled Level Control System for Liquid Solder. The printed circuit board 14 floats upon the surface of the molten solder in the bath 10 and is advanced in the direction of the arrow 16 from an entry end 17 to an exit end 18 of the bath.

In order to maintain the solder bath 10 in a molten state, a plurality of first periodically operated heaters 19 and a plurality of second periodically operated heaters 21 are positioned in grooves 22 in the bottom 23 of the pot 11 which extend parallel to the path of advancement of the board 14.

The heaters 19 are in a first bank and are in a planar, parallel array along an entry section of the bath 10 while the heaters 21 are in a second planar, parallel array along an exit section of the bath. In order to compensate for solder which leaves the pot 11 as successive boards are dragged over the pot, additional solder may be added to the molten solder 10 by simply placing solid solder bars in the molten solder in a conventional manner. The level of solder in the pot 11 may be maintained by a displacement block such as that disclosed in the aforementioned U.S. Pat. No. 3,570,741, to Corsaro and Smith issued Mar. 16, 1971, and entitled, Level Control System for Liquid Solder.

As seen in FIG. 1, the first heaters 19 are longer than the second heaters 21 and thereby extend over and heat a greater area. The same amount of power or wattage is applied to each heater thereby giving the second heaters 21 a higher watt density output than the first heaters 19 since the second heaters heat over a smaller area than the first. Since molten solder is a relatively poor conductor of heat and because the solder in the bath 10 is substantially stagnant or generally stationary, a temperature gradient is established along the length of the bath as illustrated in FIG. 2 so that the temperature at the entry end 17 of the bath is lower than the temperature at the exit end 18 of the bath. During the soldering operations, the heat lost to the atmosphere and to the boards 14 passing through the bath is replaced by operating the heaters 19 and 21 over longer periods of time.

In order to control the heat transferred to the bath 10 by the first and second heaters 19 and 21, respectively, a thermal sensing unit 24 is inserted in the bath at a point positioned between the entry and exit ends 17 and 18 of the bath. The thermal sensing unit 24 operates an on-off switch 25 to connect a power source 26 that energizes the heaters 19 and 21 simultaneously when the unit 24 senses a temperature below a predetermined temperature at its location in the bath 10. When the temperature at the location of the sensing unit 24 exceeds the predetermined temperature, the sensing unit disconnects the power source allowing the heaters 19 and 21 to deenergize. In effect, the heaters 19 and 21 are periodically operated, the duration of operation being dependant upon the amount of heat that must be added to the bath 10 to maintain the desired thermal gradient along the length of the bath. Generally, the thermal sensing unit 24 will actuate the switch 25 when a temperature between the extremes of a desired range along the length of the bath is encountered. For example, if it is desired that the solder at the entry end 17 of the bath 10 have a temperature of 480°F while the solder at the exit has a temperature of 560°F, the thermal sensing unit 24 will activate the switch 25 when the unit senses a temperature of 515°F. Since the same amount of wattage is delivered to each heater when the heaters are turned on by the on-off switch 25 and since the heaters are of different lengths, the heat transferred to the portion of solder bath 10 adjacent the heaters will be different resulting in a gradient along the path of movement of the printed circuit board 14.

By providing a temperature gradient along the path of advancement of the printed circuit board 14, the total amount of heat transferred to the printed circuit board and the initial thermal shock to the printed circuit board can be reduced. In order to form a substantial solder connection, it is necessary to have a relatively high solder temperature at one point during the soldering operation. However, this temperature need not be maintained during the entire operation. Therefore, substantial solder connections can be made with less heat transfer to the printed circuit board 14 or article by having the initial temperature lower than the final temperature. Furthermore, a lower initial temperature results in a lower initial thermal shock to the board 14 or article due to its initial contact with the solder. Therefore, by providing a temperature gradient as shown in FIG. 2 along the path of advancement of the printed circuit board 14, the undesirable heat transfer effects due to the contact of the board with the solder bath 10 may be substantially reduced.

It has also been found that by providing the aforementioned temperature gradient, the formation of icicles on the board 14 being soldered in minimized. This is apparently the result of a reduction in surface tension at the hot side 18 of the bath 10 which causes the solder to flow back into the bath as the printed circuit board 14 exits from the bath. Furthermore, it is believed that the hot solder forms smaller droplets having less viscosity and therefore, a reduced tendency to cling to the board 14 as it leaves the bath.

In order to evenly apply the solder to the circuit paths on the underside of board 14, it is necessary that the temperature of the solder taken along lateral increments relative to the path of travel of the board be uniform. In other words, it is necessary to have isothermal lines extending across the solder bath 10 from one side 27 to the other side 28 of the pot 11. Since there is a tendency for heat to transfer rapidly out of the bath 11 through the cast iron walls 28 and 29 of the pot 21 there is a tendency for the temperature of the bath adjacent the walls to be less than that near the centerline of the bath. This tendency can be counteracted by maintaining the heaters 19A and 21A adjacent to the walls 28 and 29 of the pot 11 at a higher temperature than the heaters 19B and 21B near the centerline of the pot 11 by, for example, having coils of a lower resistance in the heaters adjacent to the walls.

By utilizing the methods of and apparatus for practicing the present invention, heat transfer is reduced approximately 35 percent and thus heat damage to the boards 14 and components thereon is substantially reduced. With the boards 14 exiting from the solder bath 10 at the hottest area of the bath, there is a substantial reduction in the tendency to deposit excess solder or solder of a consistancy that leads to the formation of icicles.

In practicing the methods of and apparatus for the present invention, the following parameters were utilized:

Solder composition range of the solder bath, 50 to 70 percent tin and 50 to 30 percent lead;
length of the solder bath, 2 to 3 feet;
speed of boards 14 through the bath, 8 to 12 ft/min.;
low temperature end of the bath, 430° to 500°F;
high temperature end of the bath, 510° to 590°F.

Although there is illustrated a specific form of substrate, i.e., a printed circuit board, in the drawings of this disclosure, it is understood that this invention is applicable to mass soldering or coating of other types of substrates or articles. It is to be understood that other changes and modifications may be made with respect to the specific elements and arrangements thereof disclosed and described and similar results will be obtained without departing from the invention.

What is claimed is:

1. A method of controlling the temperature of a solder bath in an elongated container wherein the container has a first bank of parallel heaters extending in a planar array along an entry section of the container and a second bank of parallel heaters extending in a planar array from the entry section and along an exit section of the container; which comprises:
   operating the first bank of heaters to maintain the solder along the entry section in a molten state within a first temperature range;
   operating the second bank of heaters to maintain the solder along the exit section in molten state within a second temperature range which is higher than the first temperature range to establish a thermal gradient along the length of the solder bath; and
   operating the outer heaters in each array at higher temperatures to maintain isothermal conditions across the width of the solder bath.

2. The method of claim 1 wherein the gradient 2 has a temperature differential in the range of 40° to 100°F.

3. The method of claim 1 wherein the first temperature range is 430° to 500°F and the second temperature range is 510° to 590°F.

* * * * *